United States Patent
DeBrosse et al.

(10) Patent No.: US 10,229,722 B2
(45) Date of Patent: Mar. 12, 2019

(54) THREE TERMINAL SPIN HALL MRAM

(71) Applicant: International Business Machines Corporation, Armonk, NY (US)

(72) Inventors: John K. DeBrosse, Colchester, VT (US); Jonathan Z. Sun, Shrub Oak, NY (US); Daniel C. Worledge, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/666,236

(22) Filed: Aug. 1, 2017

(65) Prior Publication Data
US 2019/0043547 A1    Feb. 7, 2019

(51) Int. Cl.
| | |
|---|---|
| G11C 11/00 | (2006.01) |
| G11C 11/16 | (2006.01) |
| H01L 43/08 | (2006.01) |
| H01L 43/04 | (2006.01) |
| H01L 43/06 | (2006.01) |
| H01L 43/10 | (2006.01) |
| G11C 11/18 | (2006.01) |
| H01L 27/22 | (2006.01) |

(52) U.S. Cl.
CPC ........ *G11C 11/161* (2013.01); *G11C 11/1673* (2013.01); *G11C 11/1675* (2013.01); *G11C 11/18* (2013.01); *H01L 27/228* (2013.01); *H01L 43/04* (2013.01); *H01L 43/065* (2013.01); *H01L 43/08* (2013.01); *H01L 43/10* (2013.01)

(58) Field of Classification Search
CPC .................................................. G11C 11/161
USPC ........................................................ 365/158
See application file for complete search history.

(56) References Cited

U.S. PATENT DOCUMENTS

| | | |
|---|---|---|
| 8,896,041 B2 | 11/2014 | De Brosse et al. |
| 9,230,626 B2 | 1/2016 | Buhrman et al. |
| 9,269,415 B1 | 2/2016 | Liu et al. |
| 9,324,402 B2 | 4/2016 | Wu et al. |
| 9,391,262 B1 | 7/2016 | Nikonov et al. |
| 9,391,266 B1 | 7/2016 | Hu et al. |
| 9,443,905 B1 | 9/2016 | Bandic et al. |

(Continued)

FOREIGN PATENT DOCUMENTS

| | | |
|---|---|---|
| CN | 104778967 A | 7/2015 |
| WO | WO2017052542 A1 | 3/2017 |

OTHER PUBLICATIONS

Aziz et al., "Hybrid Multiplexing (HYM) for Read- and Area-Optimized MRAMs With Separate Read-Write Paths," IEEE Transactions on Nanotechnology, vol. 15, Issue: 3, pp. 473-483 (May 2016).

*Primary Examiner* — Hoai V Ho
(74) *Attorney, Agent, or Firm* — Vazken Alexanian; Michael J. Chang, LLC

(57) ABSTRACT

Improved spin hall MRAM designs are provided that enable writing of all of the bits along a given word line together using a separate spin hall wire for each MTJ. In one aspect, a magnetic memory cell includes: a spin hall wire exclusive to the magnetic memory cell; an MTJ disposed on the spin hall wire, wherein the MTJ includes a fixed magnetic layer separated from a free magnetic layer by a tunnel barrier; and a pair of selection transistors connected to opposite ends of the spin hall wire. An MRAM device and method for operation thereof are also provided.

20 Claims, 8 Drawing Sheets

(56) References Cited

U.S. PATENT DOCUMENTS

| | | | |
|---|---|---|---|
| 2002/0181166 A1* | 12/2002 | Gill | B82Y 10/00 |
| | | | 360/321 |
| 2013/0005052 A1 | 1/2013 | Hu et al. | |
| 2015/0200003 A1* | 7/2015 | Buhrman | G11C 11/18 |
| | | | 365/158 |
| 2015/0213867 A1 | 7/2015 | Wu et al. | |
| 2016/0035404 A1 | 2/2016 | Ohki et al. | |
| 2016/0042778 A1 | 2/2016 | Manipatruni et al. | |
| 2016/0225982 A1* | 8/2016 | Guo | H01L 43/08 |
| 2016/0247550 A1* | 8/2016 | Fukami | H01L 43/08 |
| 2018/0061467 A1* | 3/2018 | Kan | G11C 11/1675 |

* cited by examiner

*FIG.* 10
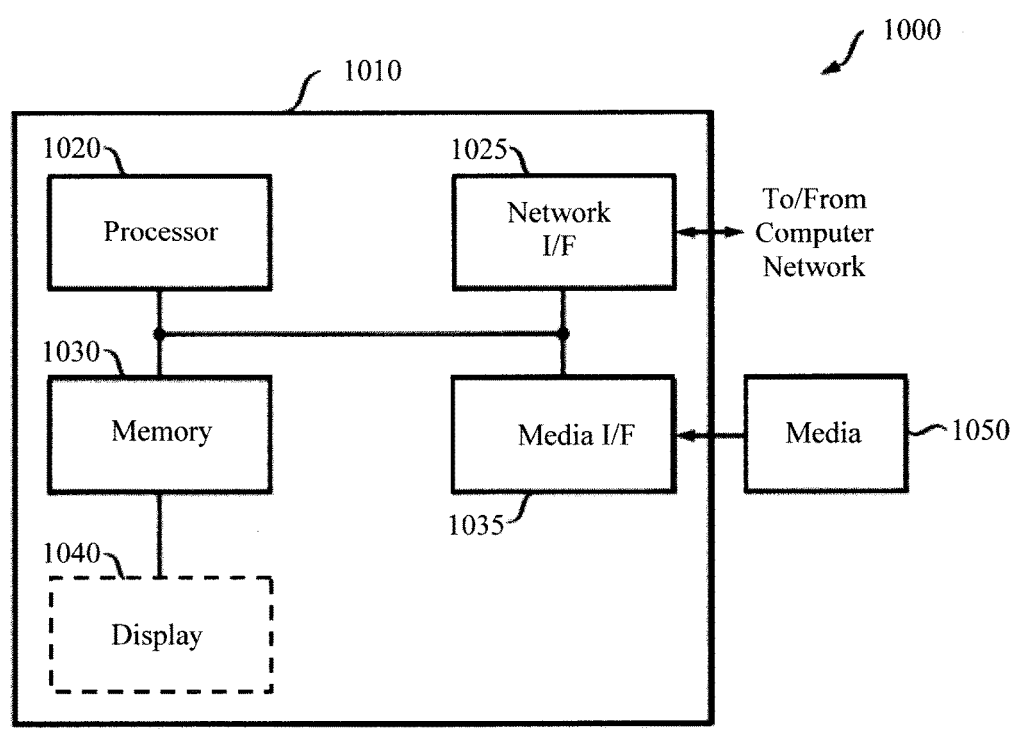

THREE TERMINAL SPIN HALL MRAM

FIELD OF THE INVENTION

The present invention relates to spin hall magnetic random access memory (MRAM), and more particularly, to improved spin hall MRAM designs that enable writing of all of the bits along a given word line together using a separate spin hall wire for each magnetic tunnel junction.

BACKGROUND OF THE INVENTION

Magnetic random access memory (MRAM) devices use magnetic memory cells to store information. Information is stored in the magnetic memory cells as an orientation of the magnetization of a free (or switchable) layer in the magnetic memory cell as compared to an orientation of the magnetization of a fixed (or reference) layer in the magnetic memory cell. The magnetization of the free layer can be oriented either parallel or anti-parallel to the fixed layer, representing either a logic "1" or a logic "0." When the magnetic memory cell is sitting in a zero applied magnetic field, the magnetization of the magnetic memory cell is stable. However, the application of a magnetic field can switch the magnetization of the free layer to write information to the magnetic memory cell.

Each magnetic memory cell includes at least one magnetic metal layer serving as the free layer, at least one other magnetic metal layer serving as the fixed layer, and a tunnel barrier oriented in a magnetic tunnel junction or MTJ stack. The tunnel barrier which is present between the free layer and the fixed layer, serves to decouple these magnetic metal layers while permitting electrons to pass therethrough.

In spin torque MRAM, the spin hall effect is leveraged for writing data whereby a spin-polarized current is passed through a spin hall wire which destabilizes the free layer in the MTJs along the spin hall wire, making them easier to write. A problem with this design, however, is that the spin hall wire has a high resistivity, thereby limiting the number of bits that can be placed on the same wire.

Therefore, improved spin torque MRAM designs would be desirable.

SUMMARY OF THE INVENTION

The present invention provides improved spin hall magnetic random access memory (MRAM) designs that enable writing of all of the bits along a given word line together using a separate spin hall wire for each magnetic tunnel junction (MTJ). In one aspect of the invention, a magnetic memory cell is provided. The magnetic memory cell includes: a spin hall wire exclusive to the magnetic memory cell; an MTJ disposed on the spin hall wire, wherein the MTJ includes a fixed magnetic layer separated from a free magnetic layer by a tunnel barrier; and a pair of selection transistors connected to opposite ends of the spin hall wire.

In another aspect of the invention, an MRAM device is provided. The MRAM device includes: bit lines; word lines oriented orthogonal to the bit lines; and magnetic memory cells in between the bit lines and word lines, wherein each of the magnetic memory cells includes: i) a spin hall wire exclusive to the magnetic memory cell, ii) an MTJ disposed on the spin hall wire having a fixed magnetic layer separated from a free magnetic layer by a tunnel barrier, and iii) a pair of selection transistors connected to opposite ends of the spin hall wire.

In yet another aspect of the invention, a method for operating an MRAM device is provided. The method includes the steps of: applying a word line voltage to a given word line of the MRAM device, wherein the MRAM device includes: bit lines, word lines oriented orthogonal to the bit lines, and magnetic memory cells in between the bit lines and word lines, wherein each of the magnetic memory cells includes: i) a spin hall wire exclusive to the magnetic memory cell, ii) an MTJ disposed on the spin hall wire having a fixed magnetic layer separated from a free magnetic layer by a tunnel barrier, and iii) a pair of selection transistors connected to opposite ends of the spin hall wire; applying a first voltage Vdd to the spin hall wire in each of the magnetic memory cells to destabilize the free magnetic layer in the MTJ of each of the magnetic memory cells; applying a write voltage to each of the bit lines corresponding to a logic 1 or a logic zero; and applying a second voltage Vs to the spin hall wire in each of the magnetic memory cells, wherein Vs<Vdd, and wherein the step of applying the write voltage to each of the bit lines is performed before the step of applying the second voltage Vs to the spin hall wire.

A more complete understanding of the present invention, as well as further features and advantages of the present invention, will be obtained by reference to the following detailed description and drawings.

BRIEF DESCRIPTION OF THE DRAWINGS

FIG. 10 is a diagram illustrating an exemplary apparatus for implementing the present MRAM device according to an embodiment of the present invention.

DETAILED DESCRIPTION OF PREFERRED EMBODIMENTS

Figure 1:
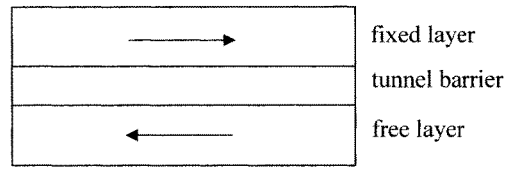
FIG. 1 is a diagram illustrating a traditional magnetic tunnel junction (MTJ) having a fixed layer, tunnel barrier, and a free layer, wherein a magnetization of the fixed layer points to the left or to the right.
Figure 2:
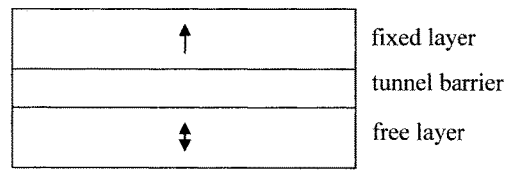
FIG. 2 is a diagram illustrating a perpendicular MTJ wherein a magnetization of the fixed layer points up or down.

As highlighted above, spin torque magnetic random access memory (MRAM) uses a (two-terminal) device with a fixed magnetic layer ("fixed layer"), tunnel barrier, and free magnetic layer ("free layer") in a magnetic tunnel junction (MTJ) stack such as is shown in FIG. 1 and FIG. 2. The two terminals are the top and the bottom of the MTJ. The orientation of the magnetization of a given layer (fixed or free) may be represented by an arrow. A double sided arrow indicates that the magnetization can be switched in the free layer to point in either direction. See FIG. 1 and FIG. 2.

FIG. 1 illustrates a traditional MTJ where the orientation of the fixed layer is pinned/fixed in direction (in this case pointing to the right as the arrow indicates). Passing a current up through the MTJ makes the magnetization of the free layer parallel to that of the fixed layer, i.e., the orientation of the magnetization of both the fixed and free layers will point to the right. Passing a current down through the MTJ makes the magnetization of the free layer anti-parallel to that of the fixed layer, i.e., the orientation of the magnetization of the fixed layer will point to the right, while the orientation of the magnetization of the free layer will point to the left. It is notable that the illustration of the fixed layer pointing to the right is merely an example, and the fixed layer can instead point to the left with the free layer switchable between being parallel (by pointing to the left) or anti-parallel (by pointing to the right) to the fixed layer.

More recently, perpendicular MTJ designs have been explored to reduce switching currents, improve thermal stability, switching reliability/accuracy, etc. See below. With perpendicular MTJs, instead of pointing to the left or to the right, the orientation of the magnetization of the fixed and free layers points either up or down. A perpendicular MTJ design is shown illustrated in FIG. 2.

In the example shown in FIG. 2, the orientation of the fixed layer is pinned/fixed in direction (in this case pointing up as the arrow indicates). In the same manner as described above, passing a current up through the MTJ makes the magnetization of the free layer parallel to that of the fixed layer, i.e., the orientation of the magnetization of both the fixed and free layers will point up. Passing a current down through the MTJ makes the magnetization of the free layer anti-parallel to that of the fixed layer, i.e., the orientation of the magnetization of the fixed layer will point up, while the orientation of the magnetization of the free layer will point down. It is notable that the illustration of the fixed layer pointing up is merely an example, and the fixed layer can instead point down with the free layer switchable between being parallel (by pointing up) or anti-parallel (by pointing down) to the fixed layer.

A smaller current (of either polarity) is used to read the resistance of the device, which depends on the relative orientations of the free and fixed layers. Earlier spin torque MRAM designs employed fixed and free layers having their magnetizations lie in the plane of the layer as shown in FIG. 1. Such in-plane magnetic anisotropy however leads to high switching currents. By contrast, materials with a magnetization perpendicular to the plane of the layer (as shown in FIG. 2) have so-called perpendicular magnetic anisotropy or PMA. See, for example, U.S. Pat. No. 9,391,266 issued to Hu et al., entitled "Perpendicular Magnetic Anisotropy BCC Multilayers," the contents of which are incorporated by reference as if fully set forth herein. However, even with perpendicular anisotropy the switching currents are still higher than desired.

The spin hall effect has recently been shown to exert large torques on magnetic layers. See, for example, FIG. 3 which shows MTJ bits, e.g., MTJ1, MTJ2, etc. arranged along a common spin hall wire. PMA MTJs (i.e., of the design shown in FIG. 2) are formed on the spin hall wire which itself possesses a large spin hall angle. The top of each MTJ is connected to a corresponding transistor. When a current is passed through the spin hall wire, spins polarized into or out of the page diffuse upwards. These spins will destabilize the perpendicularly magnetized free layer (see above), bringing its moment into the plane (either into or out of the page).

All of these bits on the same spin hall wire will be written at the same time. The purpose of the spin hall wire is only to select, or destabilize, the bits, making them easier to write. Four bits are show along the spin hall wire in FIG. 3, but other numbers of bits can be used.

For writing, a current is passed through the spin hall wire. This rotates all of the free layers into the plane (either into or out of the page, depending on the sign of the spin hall angle). Next, a small current is passed either up or down through each transistor to write each individual bit into the desired state. The spin hall current through the spin hall wire is turned off at this point. Then the small current through each of the transistors is turned off.

This method has the significant advantage of eliminating write errors, which are a key problem for standard spin torque MRAM. In standard spin torque MRAM, there is no torque when the current is first applied, unless the free layer thermally fluctuates away from equilibrium. With the present techniques, the spin hall wire supplies spins at 90 degrees to the initial free layer magnetization direction, thus ensuring that the free layer responds reliably.

Figure 3:
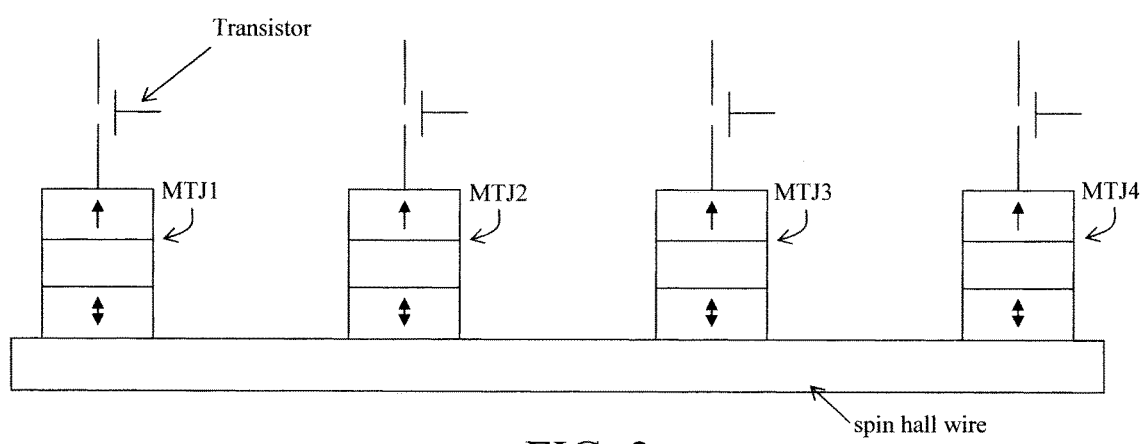
FIG. 3 is a diagram illustrating an exemplary spin torque magnetic random access memory (MRAM) design with multiple MJN sharing a common spin hall wire.

A challenge with the spin torque design provided in FIG. 3 is that one needs to engineer the system so that the sum of all of the small currents through the transistors cannot destabilize a junction at the end of the spin hall wire (i.e., during the second phase of writing when current is not (intentionally) put through the spin hall wire to destabilize (which is the first phase), but only through each junction to write it up or down). Also, the spin hall wire has a high resistivity. Both of these effects limit the number of bits on the spin hall wire to a small number, like 2 or 4 bits.

Advantageously, provided herein are improved three terminal spin torque MRAM designs and techniques for use thereof that retain the reliable writing of the spin hall write as just described, but which do not have the spin hall wire common to all MTJs along a given word line (WL). Specifically, a single, separate spin hall (SH) wire is used for each MTJ. Therefore, each bit can be written without concern about the effects the current introduced to the spin hall wire will have on adjacent bits. The three terminals are the top of the MTJ and the left and right ends of the spin hall wire.

Figure 4:
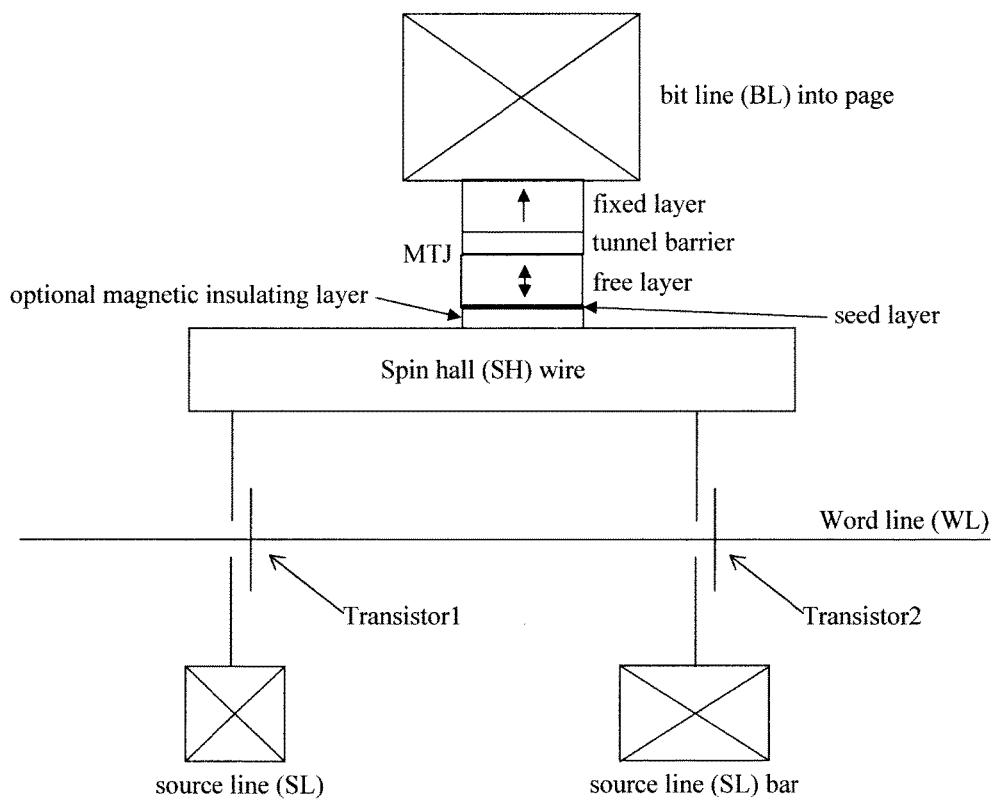
FIG. 4 is a diagram illustrating a single magnetic memory cell according to an embodiment of the present invention.

An exemplary configuration of a single magnetic memory cell according to the present techniques is shown in FIG. 4. In FIG. 4, and throughout, the structure extending along the plane into and out of the page are denoted with an X pattern. Thus, for instance, the bit line, the source line and the source line bar run into the page. By contrast, the spin hall wire and the word line run left and right on the page, and thus are perpendicular to the bit line, the source line and the source line bar. It is notable that the terms "source line" and "source line bar" are used interchangeably herein as they perform the same function. The term "bar" simply refers to a source line that is connected on the other side of the spin hall wire from the source line.

As provided above, each magnetic memory cell includes an MTJ having a free layer, a fixed layer, and a tunnel barrier separating the fixed and free layers. PMA MTJS are used in the present design. As described above, PMA MTJs employ magnetic metals for the fixed and free layers having a magnetization perpendicular to the plane of the layer. See FIG. 2, described above. For instance, as shown in FIG. 4, the MTJ in this case has a fixed layer with a magnetization pointing up (which could alternatively be in a fixed direction pointing down) and a free layer with a magnetization which can be switched between pointing either up (parallel to the fixed layer) or down (anti-parallel to the fixed layer). As above, arrows are used to indicate the orientation of the magnetization of the magnetic metal layers.

Suitable PMA MTJ designs are described, for example, in U.S. Patent Application Publication Number 2013/0005052 by Hu et al., entitled "Magnetic Tunnel Junction with Iron Dusting Layer between Free Layer and Tunnel Barrier" (hereinafter "U.S. Patent Application Publication Number 2013/0005052") the contents of which are incorporated by reference as if fully set forth herein. For instance, according to an exemplary embodiment, each MTJ is grown on top of the respective spin hall wire. To do so, an optional seed layer is first formed on the spin hall wire or, as shown in FIG. 4 on an optional magnetic insulating layer (see below), and the free layer is grown on the seed layer. Suitable materials for the seed layer include, but are not limited to, tantalum (Ta) and/or tantalum magnesium (TaMg) or, alternatively, no seed layer may be used. Suitable materials for the free layer include, but are not limited to, cobalt-iron-boron (CoFeB).

Next, the tunnel barrier is formed on the free layer. Suitable materials for the tunnel barrier include, but are not limited to, a non-magnetic insulating material such as magnesium oxide (MgO). The fixed layer is then formed on top of the tunnel barrier. It is notable that any of the components of the MTJ can include multiple layers. For instance, the fixed layer can be a multilayer structure including a layer of CoFeB in combination with one or more interfacial layers, or spacers, and cobalt-platinum (Co|Pt) or cobalt-palladium (Co|Pd), in multi-layers or a mixture. See, for example, U.S. Patent Application Publication Number 2013/0005052.

The MTJ is formed on top of a cell-specific spin hall wire, meaning that the spin hall wire is exclusive to that particular magnetic memory cell and not shared between multiple MTJs. Optionally, the free layer of the MTJ may be separated from the spin hall wire by a magnetic insulating layer. See FIG. 4. The magnetic insulating layer prevents the spin hall current (passed through the spin hall wire) from being diluted by flowing into the free layer itself. Suitable materials for the magnetic insulating layer include, but are not limited to, ferromagnetic, ferrimagnetic, or antiferromagnetic insulators, such as nickel oxide (NiOx) which is an antiferromagnetic insulator, or cobalt-iron-oxide (CoFeOx). According to an exemplary embodiment, the magnetic insulating layer has a thickness of from about 1 nanometer (nm) to about 3 nm, and ranges therebetween. The use of a magnetic insulating layer is however optional, and embodiments are anticipated herein where the MTJ is disposed directly on the spin hall wire.

As shown in FIG. 4, implementing a cell-specific spin hall wire requires two transistors (i.e., pair of Transistor 1 and Transistor 2) for each MTJ. While this increases the area of each magnetic memory cell, the advantage is that now the spin hall wire can be of a higher electrical resistivity (p) and therefore more efficient at creating a spin current. The spin hall wire may be formed from an element, compound, or alloy which has a large spin hall angle, e.g., a spin hall angle greater than a given threshold. By way of example only, suitable elements for the spin hall wire include, but are not limited to, tungsten (W), tantalum (Ta), platinum (Pt), bismuth (Bi), selenium (Se) and combinations/alloys thereof such as bismuth-selenium (BiSe). See, for example, U.S. Pat. No. 8,896,041 issued to De Brosse et al., entitled "Spin Hall Effect Assisted Spin Transfer Torque Magnetic Random Access Memory," the contents of which are incorporated by reference as if fully set forth herein.

In general, each of the transistors includes a source region and a drain region interconnected by a channel region, and a gate that regulates charge flow through the channel region. In the present design, these transistors may also be referred to herein as selection transistors since they are used to select a specific one of the magnetic memory cells. Two selection transistors are needed per magnetic memory cell in order to energize the spin hall wire (see below). The gate of each transistor is connected to the word line (WL) (with the gates of the transistors for the same magnetic memory cell being connected to the same word line). The source region of each transistor is connected to a source line. The drain of each transistor is connected to the spin hall wire.

Figure 5:
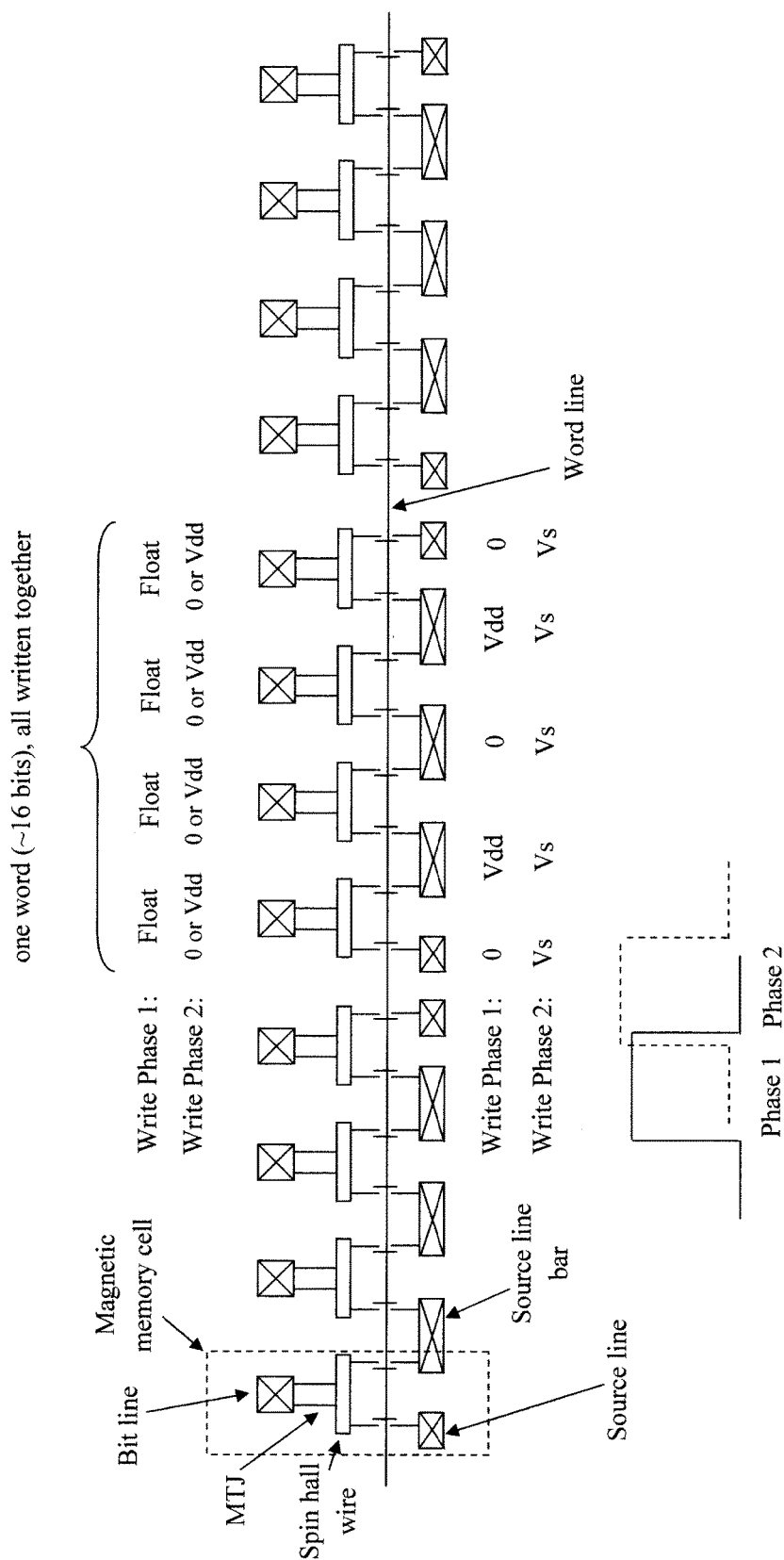
FIG. 5 is a diagram illustrating multiple magnetic memory cells (each configured as per FIG. 4) along a given word line and a write operation being performed according to an embodiment of the present invention.

FIG. 5 is a diagram illustrating multiple magnetic memory cells (each configured as shown in FIG. 4) along a common word line (WL). As shown in FIG. 5, each spin hall wire is exclusive to only one of the magnetic memory cells, i.e., the spin hall wire is not shared by adjacent magnetic memory cells. However, the source lines of adjacent cells are connected, which saves area.

Figure 6:
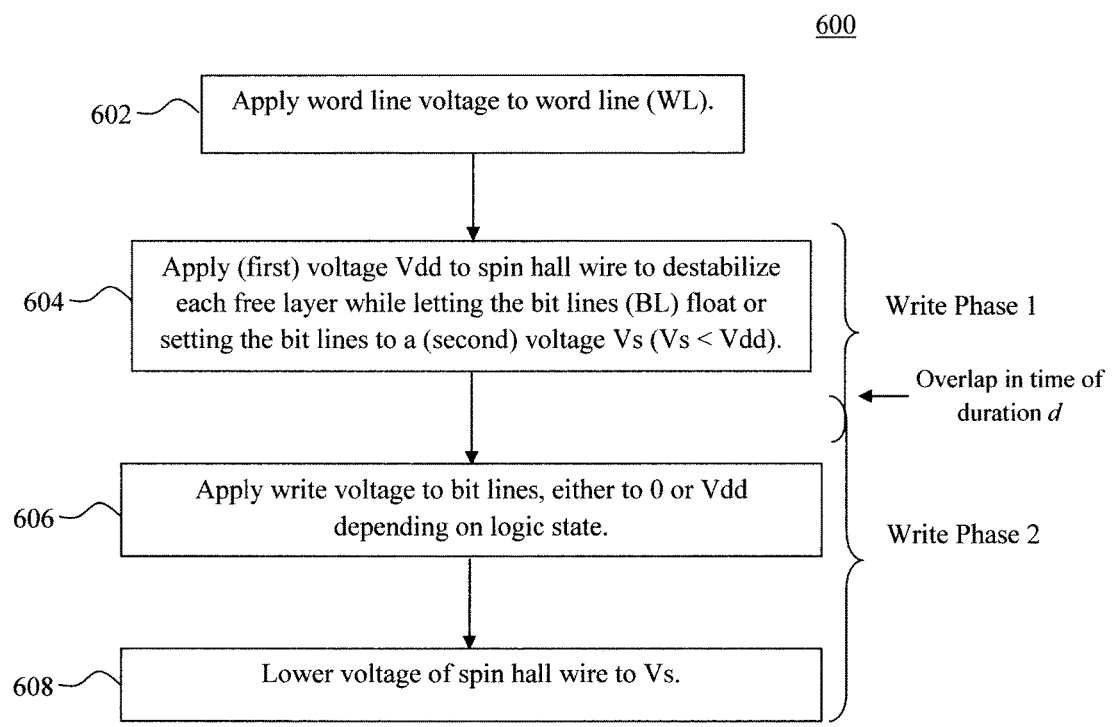
FIG. 6 is a diagram illustrating an exemplary methodology for performing a write operation with the row of magnetic memory cells of FIG. 5 according to an embodiment of the present invention.

A write operation for this row of magnetic memory cells is now described by way of reference to FIG. 5 and methodology 600 of FIG. 6. In this example, all of the magnetic memory cells along the given word line (WL) are written together. According to an exemplary embodiment, the given word line has about 16 bits. Compare, for example, the above-described configurations sharing a common spin hall wire which limits the number of bits on the spin hall wire to a small number, like 2 or 4 bits. There are two phases to the writing, a Write Phase 1 and a Write Phase 2. As will be described in detail below, the timing of the two phases is important. More specifically, the Write Phase 1 and the Write Phase 2 should overlap, meaning that the Write Phase 2 should commence prior to completing the Write Phase 1.

Referring to step 602 of methodology 600, the write phase begins by first applying a word line voltage to the given word line in order to select the magnetic memory cells along the given word line. Namely, as shown in FIG. 5 the gate of each selection transistor is connected to the word line. Thus, applying a voltage to the given word line shown in FIG. 5 will serve to select all of the magnetic memory cells along that word line, such that all of the magnetic memory cells can be written together.

The first phase of the two-phase write process (Write Phase 1) begins in step 604 by next applying a first voltage (Vdd) to each spin hall wire thereby energizing the spin hall wire in each magnetic memory cell along the given word line. This serves to destabilize the free layer in each corresponding magnetic memory cell along the given word line to point into the plane (and essentially erases all pre-existing data). Namely, as described above, the magnetization of the free layer in a PMA MTJ is perpendicular to the plane of the layer (and either parallel or anti-parallel to the fixed layer). See, for example, FIG. 4. However, when destabilized, the magnetization of the free layer will rotate 90° such that it is pointing to either the left or the right along the plane of the layer (also referred to here as "in-plane"). Thus, once destabilized, the magnetization of the free layer needs only to rotate another 90° in either way to register a logic 1 or 0.

According to an exemplary embodiment, energizing the spin hall wire in each magnetic memory cell is accomplished by applying 0 volts (V) and Vdd, in an alternating manner, to the first and second source lines, respectively, connected to each magnetic memory cell. See FIG. 5. For instance, referring to FIG. 5 and more specifically to the four magnetic memory cells shown under the bracket, zero (0) volts will be applied to the leftmost source line, Vdd will be applied to the next adjacent source line (or source line bar) to the right, zero (0) volts will be applied to the next adjacent source line (or source line bar) to the right, and so on. The result is that each spin hall wire will see both zero (0) volts and Vdd at opposite ends thereof.

During this first phase (Write Phase 1), the bit lines are left floating (i.e., the bit lines are left open with no voltage applied). See FIG. 5. Alternatively, the bit lines can be set to a second voltage (i.e., source voltage (Vs)), wherein the second voltage is less than the first voltage—see below. Namely, it is better to figure out what voltage the bit lines will float to, and intentionally set Vs to that voltage. However, this is a little more complicated than just letting the bit lines float. On the other hand, the downside to letting the bit lines float is that it may be slower, since it takes time for the bit lines to float to that voltage.

The second phase of the two-phase write process (Write Phase 2) is performed in step 606 by applying a write voltage to the bit lines which is either zero (0) V or Vdd depending on whether the respective bit is being written to a logic zero (0) or a logic 1, and in step 608 by lowering the voltage of the spin hall wire to the second voltage, e.g., Vs. Step 608 can be performed by bringing the source lines to Vs. See also FIG. 5. Namely, the free layer of each MTJ (destabilized in the first phase) will now be oriented pointing perpendicular to the plane of the layer, either parallel or anti-parallel relative to the fixed layer. According to an exemplary embodiment, Vs is less than or equal to Vdd/2. By way of example only, Vs can be from about 0.3 Vdd to about 0.5 Vdd, and ranges therebetween, where Vdd=0.8V. Thus, bringing a given bit line to 0V will cause current to pass up through the respective MTJ, while bringing a given bit line to Vdd will cause current to pass down through the respective MTJ, registering either a logic 1 or a logic 0. As will be described in further detail below, the magnetic memory cells are part of an array having multiple word lines and bit lines with each magnetic memory cell being at the intersection of a given word line and bit line. Thus, the individual bit lines (in step 606) are used to write individual magnetic memory cells along the selected word line (as per step 602—described above).

As highlighted above, the timing of the two write phases (i.e., Write Phase 1 and Write Phase 2) is important. More specifically, as shown in FIGS. 5 and 6, the two write phases have to overlap one another in time (i.e., temporal overlap). As such step 606 (Write Phase 2) has to commence before step 604 (Write Phase 1) is completed. In fact, it is preferable for Write Phase 1 to overlap Write Phase 2 by a duration d of less than about 5 nanoseconds (ns), e.g., from about 0.1 ns to about 5 ns, and ranges therebetween.

Thus, to use a simple example to illustrate this concept the word line is selected as per step 602. Next, 0V and Vdd are applied to alternating source lines to energize the spin hall wires and thereby destabilize the free layers, while the bit lines are allowed to float (or are kept at Vs) as per step 604. The bit lines are then brought to 0V or Vdd as per step 606, however some time is permitted to pass (e.g., of duration d) before the source lines are brought to Vs as per step 608. The steps of methodology 600 can be performed by applying voltage pulses to the respective word line, bit line, source line, etc. The timing of these pulses can be coordinated such that the steps of each phase are performed in the correct order including the overlap between the phases.

Figure 7:
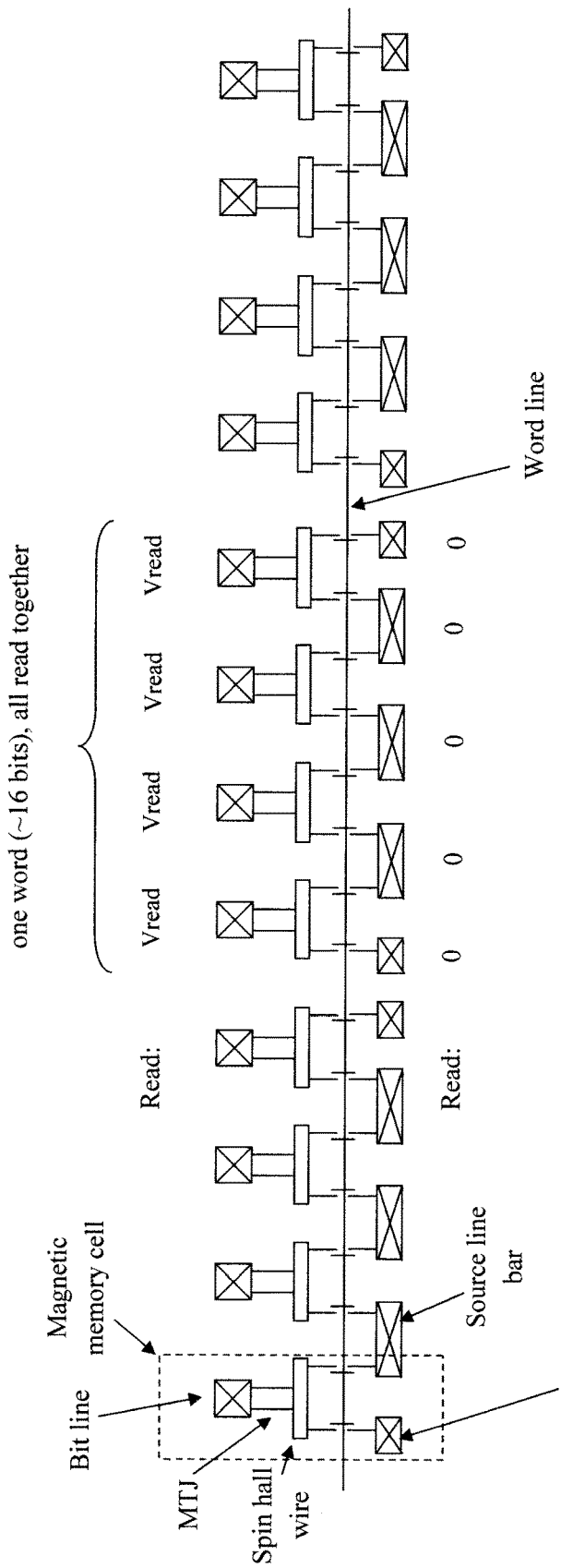
FIG. 7 is a diagram illustrating a read operation being performed for multiple magnetic memory cells (each configured as per FIG. 4) along a given word line according to an embodiment of the present invention.
Figure 8:
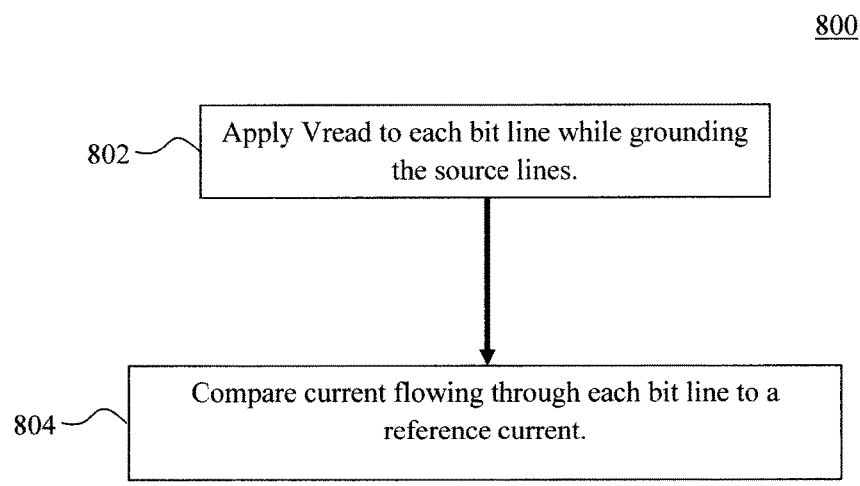
FIG. 8 is a diagram illustrating an exemplary methodology for performing a read operation with the row of magnetic memory cells of FIG. 7 according to an embodiment of the present invention.

A read operation is now described by way of reference to FIG. 7 and methodology 800 of FIG. 8. As compared to the two-phase write described above, the read operation is relatively simple. For instance, referring to step 802 of methodology 800 a read voltage (Vread) is applied to each bit line, while the source lines are grounded. This operation is illustrated in FIG. 7. According to an exemplary embodiment, Vread is from about 50 millivolts (mV) to about 300 mV, and ranges therebetween, e.g., about 100 mV.

Next, in step 804 the current flowing through each bit line is compared to a reference current to determine whether each given bit stores a logic 1 or a logic 0. Namely, when the magnetization of the fixed and free layers in the MTJ bit are oriented parallel to one another, the resistance is generally lower than when they are oriented anti-parallel to one another. As such, the two logic states can be easily discerned when compared to a constant reference current.

Figure 9:
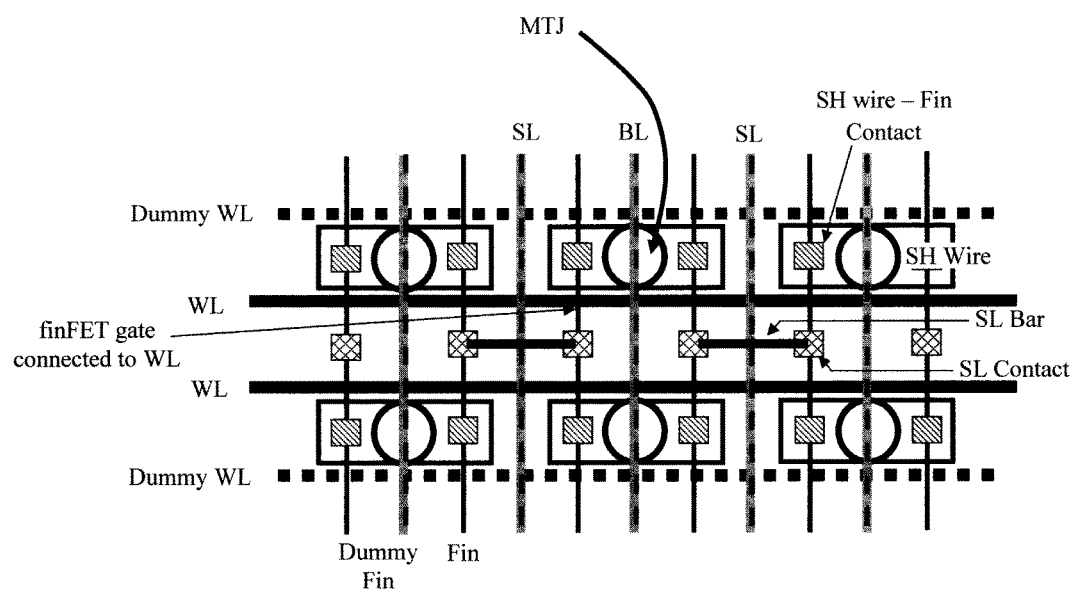
FIG. 9 is a schematic top-down diagram illustrating an exemplary configuration of the present MRAM device according to an embodiment of the present invention.

An exemplary configuration of the present MRAM device is shown in FIG. 9, which provides a schematic top-down view. In the example shown in FIG. 9, fin field effect transistors (finFETs) are employed as the selection transistors. As provided above, each transistor includes a source region and a drain region connected by a channel region, and a gate that regulates charge flow through the channel region. In this case, the channel region is fin shaped. See FIG. 9 where the fins extend vertically on the page. Dotted lines are used to denote 'dummy' fins. By dummy fins, it is meant that there are fins formed which do not serve as the basis for a transistor and are thus not used in the device. However, from a processing standpoint, it is easier to produce a regular pattern of fins and simply use only those fins needed in the device to form the selection transistors.

In this exemplary embodiment, a source line (SL) contact and a spin hall (SH) wire fin contact are provided to the source and drain regions, respectively, of each finFET. The gate of each finFET is present directly beneath (and connected to) a word line.

As shown in FIG. 9, the MRAM device includes a plurality of word lines (WL) (extending horizontally on the page) and a plurality of bit lines (BL) (extending vertically on the page), with the word lines oriented orthogonal to the bit lines. As provided above, the MTJs are present between the bit lines and the word lines, with the MTJ of each magnetic memory cell being at the intersection of only one bit line and word line. By way of example only, the bit lines and the word lines can run above and below the MTJs, respectively. However, configurations are anticipates herein where the word lines and the bit lines run above and below the MTJs, respectively.

As with the fins, for ease of processing, a regular pattern of the word lines, bit lines and/or source lines (SL) can be produced with only some of the lines being used in the active device. See, for example, the dummy word lines (dummy WL) which are present in the design.

With the present MRAM design, a single spin hall (SH) wire is used for each magnetic memory cell. See FIG. 9. Multiple source lines (SL) (extending vertically on the page) are employed which, in the present design, are parallel to the bit lines.

In FIG. 9, the MTJs are represented with circles. As patterned, MTJs often have a cylindrical shape which appears circular when viewed from the top down. For ease and clarity of depiction, only two MTJs are shown in FIG. 9. However, it is to be understood that the MRAM array includes many more MTJs than shown, e.g., one MTJ at each intersection of a bit line and word line.

FIG. 10 is a diagram illustrating an exemplary apparatus 1000 in which the present MRAM device may be embodied to perform the present techniques. Apparatus 1000 includes a computer system 1010 and removable media 1050. Computer system 1010 includes a processor device 1020, a network interface 1025, a memory 1030, a media interface 1035 and an optional display 1040. Network interface 1025 allows computer system 1010 to connect to a network, while media interface 1035 allows computer system 1010 to interact with media, such as a hard drive or removable media 1050.

Processor device 1020 can be configured to implement the methods, steps, and functions disclosed herein. The memory 1030 could be distributed or local and the processor device 1020 could be distributed or singular. The memory 1030 could be implemented as an electrical, magnetic or optical memory, or any combination of these or other types of storage devices. Moreover, the term "memory" should be construed broadly enough to encompass any information able to be read from, or written to, an address in the addressable space accessed by processor device 1020. With this definition, information on a network, accessible through network interface 1025, is still within memory 1030 because the processor device 1020 can retrieve the information from the network. It should be noted that each distributed processor that makes up processor device 1020 generally contains its own addressable memory space. It should also be noted that some or all of computer system 1010 can be incorporated into an application-specific or general-use integrated circuit.

Optional display 1040 is any type of display suitable for interacting with a human user of apparatus 1000. Generally, display 1040 is a computer monitor or other similar display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A magnetic memory cell, comprising:
   a spin hall wire exclusive to the magnetic memory cell;
   a magnetic tunnel junction (MTJ) disposed on the spin hall wire, wherein the MTJ comprises a fixed magnetic layer separated from a free magnetic layer by a tunnel barrier, and wherein the MTJ is an only MTJ disposed on the spin hall wire; and
   a pair of selection transistors connected to opposite ends of the spin hall wire, wherein each selection transistor in the pair of selection transistors comprises a source region and a drain region interconnected by a channel region, and a gate configured to regulate charge flow through the channel region, and wherein the source region is connected to an adjacent selection transistor of an adjacent magnetic memory cell.

2. The magnetic memory cell of claim 1, further comprising:
   a magnetic insulating layer in between the MTJ and the spin hall wire.

3. The magnetic memory cell of claim 2, wherein the magnetic insulating layer comprises nickel oxide.

4. The magnetic memory cell of claim 1, wherein the fixed magnetic layer and the free magnetic layer each comprises cobalt-iron-boron.

5. The magnetic memory cell of claim 1, wherein the tunnel barrier comprises magnesium oxide.

6. The magnetic memory cell of claim 1, wherein the spin hall wire comprises a material selected from the group consisting of: tungsten, tantalum, platinum, bismuth, selenium, and combinations thereof.

7. A magnetic random access memory (MRAM) device, comprising:
   bit lines;
   word lines oriented orthogonal to the bit lines; and
   magnetic memory cells in between the bit lines and word lines, wherein each of the magnetic memory cells comprises: i) a spin hall wire exclusive to the magnetic memory cell, ii) an MTJ disposed on the spin hall wire comprising a fixed magnetic layer separated from a free magnetic layer by a tunnel barrier, wherein the MTJ is an only MTJ disposed on the spin hall wire, and iii) a pair of selection transistors connected to opposite ends of the spin hall wire, wherein each selection transistor in the pair of selection transistors comprises a source region and a drain region interconnected by a channel region, and a gate configured to regulate charge flow through the channel region, wherein the gate is connected to a given one of the word lines with the gates of the selection transistors for a same magnetic memory cell being connected to a same word line.

8. The MRAM device of claim 7, wherein the drain region of the selection transistor is connected to the spin hall wire.

9. The MRAM device of claim 7, further comprising:
   source lines oriented parallel to the bit lines.

10. The MRAM device of claim 9, wherein the source region of the selection transistor is connected to one of the source lines.

11. The MRAM device of claim 7, wherein each of the magnetic memory cells further comprises:
    a magnetic insulating layer in between the MTJ and the spin hall wire.

12. The MRAM device of claim 11, wherein the magnetic insulating layer comprises nickel oxide.

13. A method for operating an MRAM device, the method comprising the steps of:
    applying a word line voltage to a given word line of the MRAM device, wherein the MRAM device comprises: bit lines, word lines oriented orthogonal to the bit lines, source lines oriented parallel to the bit lines, and magnetic memory cells in between the bit lines and word lines, wherein each of the magnetic memory cells comprises: i) a spin hall wire exclusive to the magnetic memory cell, ii) an MTJ disposed on the spin hall wire comprising a fixed magnetic layer separated from a free magnetic layer by a tunnel barrier, wherein the MTJ is an only MTJ disposed on the spin hall wire, and iii) a pair of selection transistors connected to opposite ends of the spin hall wire, wherein each selection transistor in the pair of selection transistors comprises a source region and a drain region interconnected by a channel region, and a gate configured to regulate charge flow through the channel region, wherein the gate is connected to a given one of the word lines, wherein the drain region of the selection transistor is connected to the spin hall wire, and wherein the source region of the selection transistor is connected to one of the source lines;
    applying a first voltage Vdd to the spin hall wire, via the source lines, in each of the magnetic memory cells to destabilize the free magnetic layer in the MTJ of each of the magnetic memory cells;
    applying a write voltage to each of the bit lines corresponding to a logic 1 or a logic 0; and applying a second voltage Vs to the spin hall wire, via the source lines, in each of the magnetic memory cells, wherein Vs<Vdd, wherein the step of applying the write voltage to each of the bit lines is performed before the step of applying the second voltage Vs to the spin hall wire.

14. The method of claim 13, wherein Vs is less than or equal to Vdd/2.

15. The method of claim 13, wherein a duration d is permitted to pass after the step of applying the write voltage to each of the bit lines is performed before performing the step of applying the second voltage Vs to the spin hall wire, wherein d is from about 0.1 ns to about 5 ns, and ranges therebetween.

16. The method of claim 13, wherein the write voltage is either 0 volts or Vdd.

17. The method of claim 13, further comprising the step of:

letting the bit lines float while the first voltage Vdd is applied to the spin hall wire in each of the magnetic memory cells to destabilize the free magnetic layer in the MTJ of each of the magnetic memory cells.

18. The method of claim 13, further comprising the step of:

applying Vs to the bit lines while the first voltage Vdd is applied to the spin hall wire in each of the magnetic memory cells to destabilize the free magnetic layer in the MTJ of each of the magnetic memory cells.

19. The method of claim 13, further comprising the steps of:

applying a read voltage to each of the bit lines, while the source lines are grounded; and comparing current flowing through each of the bit lines to a reference current to determine whether each of the magnetic memory cells stores a logic 1 or a logic 0.

20. The MRAM device of claim 7, wherein the source region is connected to an adjacent selection transistor of an adjacent magnetic memory cell.

\* \* \* \* \*